United States Patent
Shu et al.

(10) Patent No.: US 10,943,648 B1
(45) Date of Patent: Mar. 9, 2021

(54) ULTRA LOW VDD MEMORY CELL WITH RATIOLESS WRITE PORT

(71) Applicant: GSI Technology, Inc., Sunnyvale, CA (US)

(72) Inventors: Lee-Lean Shu, Sunnyvale, CA (US); Patrick Chuang, Sunnyvale, CA (US); Chao-Hung Chang, Sunnyvale, CA (US)

(73) Assignee: GSI Technology, Inc., Sunnyvale, CA (US)

( * ) Notice: Subject to any disclaimer, the term of this patent is extended or adjusted under 35 U.S.C. 154(b) by 0 days.

(21) Appl. No.: 16/785,153

(22) Filed: Feb. 7, 2020

Related U.S. Application Data

(63) Continuation-in-part of application No. 15/709,401, filed on Sep. 19, 2017, now Pat. No. 10,249,362, and a continuation-in-part of application No. 15/709,399, filed on Sep. 9, 2017.

(60) Provisional application No. 62/430,767, filed on Dec. 6, 2016.

(51) Int. Cl.
*G11C 11/00* (2006.01)
*G11C 11/419* (2006.01)
*H03K 19/0944* (2006.01)
*G11C 11/412* (2006.01)

(52) U.S. Cl.
CPC .......... *G11C 11/419* (2013.01); *G11C 11/412* (2013.01); *H03K 19/09441* (2013.01)

(58) Field of Classification Search
CPC ................. G11C 11/419; G11C 11/412; H03K 19/09441

USPC .......................................................... 365/154
See application file for complete search history.

(56) References Cited

U.S. PATENT DOCUMENTS

| | | |
|---|---|---|
| 3,451,694 A | 6/1969 | Hass |
| 3,747,952 A | 7/1973 | Graebe |
| 3,795,412 A | 3/1974 | John |
| 4,227,717 A | 10/1980 | Bouvier |
| 4,308,505 A | 12/1981 | Messerschmitt |
| 4,587,496 A | 5/1986 | Wolaver |
| 4,594,564 A | 6/1986 | Yarborough, Jr. |
| 4,677,394 A | 6/1987 | Vollmer |
| 4,716,322 A | 12/1987 | D'Arrigo et al. |
| 4,741,006 A | 4/1988 | Yamaguchi et al. |
| 4,856,035 A | 8/1989 | Lewis |
| 5,008,636 A | 4/1991 | Markinson |
| 5,302,916 A | 4/1994 | Pritchett |
| 5,375,089 A | 12/1994 | Lo |
| 5,382,922 A | 1/1995 | Gersbach et al. |
| 5,400,274 A | 3/1995 | Jones et al. |
| 5,473,574 A | 12/1995 | Clemen et al. |

(Continued)

FOREIGN PATENT DOCUMENTS

| | | |
|---|---|---|
| CN | 104752431 | 7/2015 |
| DE | 10133281 A1 | 1/2002 |
| JP | 2005-346922 | 12/2005 |

OTHER PUBLICATIONS

US 10,564,982 B1, 02/2020, Oh et al. (withdrawn)

(Continued)

*Primary Examiner* — Vu A Le
(74) *Attorney, Agent, or Firm* — DLA Piper LLP (US)

(57) ABSTRACT

An ultra low VDD memory cell has a ratioless write port. In some embodiments, the VDD operation level can be as low as the threshold voltage of NMOS and PMOS transistors of the cell.

8 Claims, 6 Drawing Sheets

(56) References Cited

U.S. PATENT DOCUMENTS

| | | |
|---|---|---|
| 5,530,383 A | 6/1996 | May |
| 5,535,159 A | 7/1996 | Nii |
| 5,563,834 A | 10/1996 | Longway et al. |
| 5,587,672 A | 12/1996 | Ranganathan et al. |
| 5,608,354 A | 3/1997 | Hori |
| 5,661,419 A | 8/1997 | Bhagwan |
| 5,696,468 A | 12/1997 | Nise |
| 5,736,872 A | 4/1998 | Sharma et al. |
| 5,744,979 A | 4/1998 | Goetting |
| 5,744,991 A | 4/1998 | Jefferson et al. |
| 5,748,044 A | 5/1998 | Xue |
| 5,768,559 A | 6/1998 | Iino et al. |
| 5,805,912 A | 9/1998 | Johnson et al. |
| 5,883,853 A | 3/1999 | Zheng et al. |
| 5,937,204 A | 8/1999 | Schinnerer |
| 5,942,949 A | 8/1999 | Wilson et al. |
| 5,963,059 A | 10/1999 | Partovi et al. |
| 5,969,576 A | 10/1999 | Trodden |
| 5,969,986 A | 10/1999 | Wong |
| 5,977,801 A | 11/1999 | Boerstler |
| 5,999,458 A | 12/1999 | Nishimura et al. |
| 6,005,794 A | 12/1999 | Sheffield et al. |
| 6,044,034 A | 3/2000 | Katakura |
| 6,058,063 A | 5/2000 | Jang |
| 6,072,741 A | 6/2000 | Taylor |
| 6,100,721 A | 8/2000 | Durec et al. |
| 6,100,736 A | 8/2000 | Wu et al. |
| 6,114,920 A | 9/2000 | Moon et al. |
| 6,115,320 A | 9/2000 | Mick et al. |
| 6,133,770 A | 10/2000 | Hasegawa |
| 6,167,487 A | 12/2000 | Camacho |
| 6,175,282 B1 | 1/2001 | Yasuda |
| 6,226,217 B1 | 5/2001 | Riedlinger et al. |
| 6,262,937 B1 | 7/2001 | Arcoleo et al. |
| 6,263,452 B1 | 7/2001 | Jewett et al. |
| 6,265,902 B1 | 7/2001 | Klemmer et al. |
| 6,286,077 B1 | 9/2001 | Choi et al. |
| 6,310,880 B1 | 10/2001 | Waller |
| 6,366,524 B1 | 4/2002 | Abedifard |
| 6,377,127 B1 | 4/2002 | Fukaishi et al. |
| 6,381,684 B1 | 4/2002 | Hronik et al. |
| 6,385,122 B1 | 5/2002 | Chang |
| 6,407,642 B2 | 6/2002 | Dosho et al. |
| 6,418,077 B1 | 7/2002 | Naven |
| 6,441,691 B1 | 8/2002 | Jones et al. |
| 6,448,757 B2 | 9/2002 | Hill |
| 6,473,334 B1 | 10/2002 | Bailey et al. |
| 6,483,361 B1 | 11/2002 | Chiu |
| 6,504,417 B1 | 1/2003 | Cecchi et al. |
| 6,538,475 B1 | 3/2003 | Johansen et al. |
| 6,567,338 B1 | 5/2003 | Mick |
| 6,594,194 B2 | 7/2003 | Gold |
| 6,642,747 B1 | 11/2003 | Chiu |
| 6,661,267 B2 | 12/2003 | Walker et al. |
| 6,665,222 B2 | 12/2003 | Wright et al. |
| 6,683,502 B1 | 1/2004 | Groen et al. |
| 6,683,930 B1 | 1/2004 | Dalmia |
| 6,732,247 B2 | 5/2004 | Berg et al. |
| 6,744,277 B1 | 6/2004 | Chang et al. |
| 6,757,854 B1 | 6/2004 | Zhao et al. |
| 6,789,209 B1 | 9/2004 | Suzuki et al. |
| 6,816,019 B2 | 11/2004 | Delbo' et al. |
| 6,836,419 B2 | 12/2004 | Loughmiller |
| 6,838,951 B1 | 1/2005 | Nieri et al. |
| 6,842,396 B2 | 1/2005 | Kono |
| 6,853,696 B1 | 2/2005 | Moser et al. |
| 6,854,059 B2 | 2/2005 | Gardner |
| 6,856,202 B2 | 2/2005 | Lesso |
| 6,859,107 B1 | 2/2005 | Moon et al. |
| 6,882,237 B2 | 4/2005 | Singh et al. |
| 6,897,696 B2 | 5/2005 | Chang et al. |
| 6,933,789 B2 | 8/2005 | Molnar et al. |
| 6,938,142 B2 | 8/2005 | Pawlowski |
| 6,940,328 B2 | 9/2005 | Lin |
| 6,954,091 B2 | 10/2005 | Wurzer |
| 6,975,554 B1 | 12/2005 | Lapidus et al. |
| 6,998,922 B2 | 2/2006 | Jensen et al. |
| 7,002,404 B2 | 2/2006 | Gaggl et al. |
| 7,002,416 B2 | 2/2006 | Pettersen et al. |
| 7,003,065 B2 | 2/2006 | Homol et al. |
| 7,017,090 B2 | 3/2006 | Endou et al. |
| 7,019,569 B2 | 3/2006 | Fan-Jiang |
| 7,042,271 B2 | 5/2006 | Chung et al. |
| 7,042,792 B2 | 5/2006 | Lee et al. |
| 7,042,793 B2 | 5/2006 | Masuo |
| 7,046,093 B1 | 5/2006 | McDonagh et al. |
| 7,047,146 B2 | 5/2006 | Chuang et al. |
| 7,053,666 B2 | 5/2006 | Tak et al. |
| 7,095,287 B2 | 8/2006 | Maxim et al. |
| 7,099,643 B2 | 8/2006 | Lin |
| 7,141,961 B2 | 11/2006 | Hirayama et al. |
| 7,142,477 B1 | 11/2006 | Tran et al. |
| 7,152,009 B2 | 12/2006 | Bokui et al. |
| 7,180,816 B2 | 2/2007 | Park |
| 7,200,713 B2 | 4/2007 | Cabot et al. |
| 7,218,157 B2 | 5/2007 | Van De Beek et al. |
| 7,233,214 B2 | 6/2007 | Kim et al. |
| 7,246,215 B2 | 7/2007 | Lu et al. |
| 7,263,152 B2 | 8/2007 | Miller et al. |
| 7,269,402 B2 | 9/2007 | Uozumi et al. |
| 7,282,999 B2 | 10/2007 | Da Dalt et al. |
| 7,312,629 B2 | 12/2007 | Chuang et al. |
| 7,313,040 B2 | 12/2007 | Chuang et al. |
| 7,330,080 B1 | 2/2008 | Stoiber et al. |
| 7,340,577 B1 | 3/2008 | Van Dyke et al. |
| 7,349,515 B1 | 3/2008 | Chew et al. |
| 7,352,249 B2 | 4/2008 | Balboni et al. |
| 7,355,482 B2 | 4/2008 | Meltzer |
| 7,355,907 B2 | 4/2008 | Chen et al. |
| 7,369,000 B2 | 5/2008 | Wu et al. |
| 7,375,593 B2 | 5/2008 | Self |
| 7,389,457 B2 | 6/2008 | Chen et al. |
| 7,439,816 B1 | 10/2008 | Lombaard |
| 7,463,101 B2 | 12/2008 | Tung |
| 7,464,282 B1 | 12/2008 | Abdollahi-Alibeik et al. |
| 7,487,315 B2 | 2/2009 | Hur et al. |
| 7,489,164 B2 | 2/2009 | Madurawe |
| 7,512,033 B2 | 3/2009 | Hur et al. |
| 7,516,385 B2 | 4/2009 | Chen et al. |
| 7,538,623 B2 | 5/2009 | Jensen et al. |
| 7,545,223 B2 | 6/2009 | Watanabe |
| 7,565,480 B2 | 7/2009 | Ware et al. |
| 7,577,225 B2 | 8/2009 | Azadet et al. |
| 7,592,847 B2 | 9/2009 | Liu et al. |
| 7,595,657 B2 | 9/2009 | Chuang et al. |
| 7,622,996 B2 | 11/2009 | Liu |
| 7,630,230 B2 | 12/2009 | Wong |
| 7,633,322 B1 | 12/2009 | Zhuang et al. |
| 7,635,988 B2 | 12/2009 | Madurawe |
| 7,646,215 B2 | 1/2010 | Chuang et al. |
| 7,646,648 B2 | 1/2010 | Arsovski |
| 7,659,783 B2 | 2/2010 | Tai |
| 7,660,149 B2 | 2/2010 | Liaw |
| 7,663,415 B2 | 2/2010 | Chatterjee et al. |
| 7,667,678 B2 | 2/2010 | Guttag |
| 7,675,331 B2 | 3/2010 | Jung et al. |
| 7,719,329 B1 | 5/2010 | Smith et al. |
| 7,719,330 B2 | 5/2010 | Lin et al. |
| 7,728,675 B1 | 6/2010 | Kennedy et al. |
| 7,737,743 B1 | 6/2010 | Gao et al. |
| 7,746,181 B1 | 6/2010 | Moyal |
| 7,746,182 B2 | 6/2010 | Ramaswamy et al. |
| 7,750,683 B2 | 7/2010 | Huang et al. |
| 7,760,032 B2 | 7/2010 | Ardehali |
| 7,760,040 B2 | 7/2010 | Zhang et al. |
| 7,760,532 B2 | 7/2010 | Shirley et al. |
| 7,782,655 B2 | 8/2010 | Shau |
| 7,812,644 B2 | 10/2010 | Cha et al. |
| 7,830,212 B2 | 11/2010 | Lee et al. |
| 7,839,177 B1 | 11/2010 | Soh |
| 7,843,239 B2 | 11/2010 | Sohn et al. |
| 7,843,721 B1 | 11/2010 | Chou et al. |
| 7,848,725 B2 | 12/2010 | Zolfaghari et al. |
| 7,859,919 B2 | 12/2010 | De La Cruz, II et al. |

(56) References Cited

U.S. PATENT DOCUMENTS

| | | |
|---|---|---|
| 7,876,163 B2 | 1/2011 | Hachigo |
| 7,916,554 B2 | 3/2011 | Pawlowski |
| 7,920,409 B1 | 4/2011 | Clark et al. |
| 7,920,665 B1 | 4/2011 | Lombaard |
| 7,924,599 B1 | 4/2011 | Evans, Jr. et al. |
| 7,940,088 B1 | 5/2011 | Sampath et al. |
| 7,944,256 B2 | 5/2011 | Masuda |
| 7,956,695 B1 | 6/2011 | Ding et al. |
| 7,965,108 B2 | 6/2011 | Liu et al. |
| 8,004,920 B2 | 8/2011 | Ito et al. |
| 8,008,956 B1 | 8/2011 | Shin et al. |
| 8,044,724 B2 | 10/2011 | Rao et al. |
| 8,063,707 B2 | 11/2011 | Wang |
| 8,087,690 B2 | 1/2012 | Kim |
| 8,089,819 B2 | 1/2012 | Noda et al. |
| 8,117,567 B2 | 2/2012 | Arsovski |
| 8,174,332 B1 | 5/2012 | Lombaard et al. |
| 8,218,707 B2 | 7/2012 | Mai |
| 8,242,820 B2 | 8/2012 | Kim |
| 8,258,831 B1 | 9/2012 | Banai et al. |
| 8,284,593 B2 | 10/2012 | Russell et al. |
| 8,294,502 B2 | 10/2012 | Lewis et al. |
| 8,400,200 B1 | 3/2013 | Kim et al. |
| 8,488,408 B1 | 7/2013 | Shu et al. |
| 8,493,774 B2 | 7/2013 | Kung et al. |
| 8,526,256 B2 | 9/2013 | Gosh et al. |
| 8,542,050 B2 | 9/2013 | Chuang et al. |
| 8,575,982 B1 | 11/2013 | Shu et al. |
| 8,593,860 B2 | 11/2013 | Shu et al. |
| 8,625,334 B2 | 1/2014 | Liaw |
| 8,643,418 B2 | 2/2014 | Ma et al. |
| 8,692,621 B2 | 4/2014 | Snowden et al. |
| 8,693,236 B2 | 4/2014 | Shu et al. |
| 8,817,550 B1 | 8/2014 | Oh |
| 8,837,207 B1 | 9/2014 | Jou et al. |
| 8,885,439 B1 | 11/2014 | Shu et al. |
| 8,971,096 B2 | 3/2015 | Jung et al. |
| 8,995,162 B2 | 3/2015 | Sang et al. |
| 9,018,992 B1 | 4/2015 | Shu et al. |
| 9,030,893 B2 | 5/2015 | Jung et al. |
| 9,053,768 B2 | 6/2015 | Shu et al. |
| 9,059,691 B2 | 6/2015 | Lin |
| 9,070,477 B1 | 6/2015 | Clark |
| 9,083,356 B1 | 7/2015 | Cheng |
| 9,093,135 B2 | 7/2015 | Khailany et al. |
| 9,094,025 B1 | 7/2015 | Cheng |
| 9,135,986 B2 | 9/2015 | Shu et al. |
| 9,142,285 B2 | 9/2015 | Hwang et al. |
| 9,159,391 B1 | 10/2015 | Shu et al. |
| 9,171,634 B2 | 10/2015 | Zheng et al. |
| 9,177,646 B2 | 11/2015 | Arsovski |
| 9,196,324 B2 | 11/2015 | Haig et al. |
| 9,240,229 B1 | 1/2016 | Oh et al. |
| 9,311,971 B1 | 4/2016 | Oh |
| 9,318,174 B1 | 4/2016 | Chuang et al. |
| 9,356,611 B1 | 5/2016 | Shu et al. |
| 9,384,822 B2 | 7/2016 | Shu et al. |
| 9,385,032 B2 | 7/2016 | Shu |
| 9,396,790 B1 | 7/2016 | Chhabra et al. |
| 9,396,795 B1 | 7/2016 | Jeloka et al. |
| 9,401,200 B1 | 7/2016 | Chan et al. |
| 9,412,440 B1 | 8/2016 | Shu et al. |
| 9,413,295 B1 | 8/2016 | Chang |
| 9,431,079 B1 | 8/2016 | Shu et al. |
| 9,443,575 B2 | 9/2016 | Yabuuchi |
| 9,484,076 B1 | 11/2016 | Shu et al. |
| 9,494,647 B1 | 11/2016 | Chuang et al. |
| 9,552,872 B2 | 1/2017 | Jung et al. |
| 9,608,651 B1 | 3/2017 | Cheng |
| 9,613,670 B2 | 4/2017 | Chuang et al. |
| 9,613,684 B2 | 4/2017 | Shu et al. |
| 9,640,540 B1 | 5/2017 | Liaw |
| 9,679,631 B2 | 6/2017 | Haig et al. |
| 9,692,429 B1 | 6/2017 | Chang et al. |
| 9,697,890 B1 | 7/2017 | Wang |
| 9,722,618 B1 | 8/2017 | Cheng |
| 9,729,159 B1 | 8/2017 | Cheng |
| 9,789,840 B2 | 10/2017 | Farooq et al. |
| 9,804,856 B2 | 10/2017 | Oh et al. |
| 9,847,111 B2 | 12/2017 | Shu et al. |
| 9,853,633 B1 | 12/2017 | Cheng et al. |
| 9,853,634 B2 | 12/2017 | Chang |
| 9,859,902 B2 | 1/2018 | Chang |
| 9,916,889 B1 | 3/2018 | Duong |
| 9,935,635 B2 | 4/2018 | Kim et al. |
| 9,966,118 B2 | 5/2018 | Shu et al. |
| 10,065,594 B2 | 9/2018 | Fukawatase et al. |
| 10,153,042 B2 | 12/2018 | Ehrman et al. |
| 10,192,592 B2 | 1/2019 | Shu et al. |
| 10,249,312 B2 | 4/2019 | Kim et al. |
| 10,249,362 B2 | 4/2019 | Shu et al. |
| 10,388,364 B2 | 8/2019 | Ishizu et al. |
| 10,425,070 B2 | 9/2019 | Cheng et al. |
| 10,521,229 B2 | 12/2019 | Shu et al. |
| 10,535,381 B2 | 1/2020 | Shu et al. |
| 10,659,058 B1 | 5/2020 | Cheng et al. |
| 10,673,440 B1 | 6/2020 | Camarota |
| 10,770,133 B1 | 9/2020 | Haig et al. |
| 10,777,262 B1 | 9/2020 | Haig et al. |
| 10,847,212 B1 | 11/2020 | Haig et al. |
| 10,847,213 B1 | 11/2020 | Haig et al. |
| 10,854,284 B1 | 12/2020 | Chuang et al. |
| 10,860,320 B1 | 12/2020 | Haig et al. |
| 10,877,731 B1 | 12/2020 | Shu et al. |
| 10,891,076 B1 | 1/2021 | Haig et al. |
| 2001/0052822 A1 | 12/2001 | Kim et al. |
| 2002/0006072 A1 | 1/2002 | Kunikiyo |
| 2002/0060938 A1 | 5/2002 | Song et al. |
| 2002/0136074 A1 | 9/2002 | Hanzawa et al. |
| 2002/0154565 A1 | 10/2002 | Noh et al. |
| 2002/0168935 A1 | 11/2002 | Han |
| 2003/0016689 A1 | 1/2003 | Hoof |
| 2003/0107913 A1 | 6/2003 | Nii |
| 2003/0185329 A1 | 10/2003 | Dickmann |
| 2004/0052152 A1 | 3/2004 | Kono |
| 2004/0053510 A1 | 3/2004 | Little et al. |
| 2004/0062138 A1 | 4/2004 | Partsch et al. |
| 2004/0090413 A1 | 5/2004 | Yoo |
| 2004/0160250 A1 | 8/2004 | Kim et al. |
| 2004/0169565 A1 | 9/2004 | Gaggl et al. |
| 2004/0199803 A1 | 10/2004 | Suzuki et al. |
| 2004/0240301 A1 | 12/2004 | Rao |
| 2004/0264279 A1 | 12/2004 | Wordeman et al. |
| 2004/0264286 A1 | 12/2004 | Ware et al. |
| 2005/0024912 A1 | 2/2005 | Chen et al. |
| 2005/0026329 A1 | 2/2005 | Kim et al. |
| 2005/0036394 A1 | 2/2005 | Shiraishi |
| 2005/0186930 A1 | 8/2005 | Rofougaran et al. |
| 2005/0226079 A1 | 10/2005 | Zhu et al. |
| 2005/0226357 A1 | 10/2005 | Yoshimura |
| 2005/0253658 A1 | 11/2005 | Maeda et al. |
| 2005/0285862 A1 | 12/2005 | Noda et al. |
| 2006/0039227 A1 | 2/2006 | Lai et al. |
| 2006/0055434 A1 | 3/2006 | Tak et al. |
| 2006/0119443 A1 | 6/2006 | Azam et al. |
| 2006/0139105 A1 | 6/2006 | Maxim et al. |
| 2006/0143428 A1 | 6/2006 | Noda et al. |
| 2006/0248305 A1 | 11/2006 | Fang |
| 2007/0001721 A1 | 1/2007 | Chen et al. |
| 2007/0047283 A1 | 3/2007 | Miyanishi |
| 2007/0058407 A1 | 3/2007 | Dosaka et al. |
| 2007/0109030 A1 | 5/2007 | Park |
| 2007/0115739 A1 | 5/2007 | Huang |
| 2007/0139997 A1 | 6/2007 | Suzuki et al. |
| 2007/0171713 A1 | 7/2007 | Hunter et al. |
| 2007/0189101 A1 | 8/2007 | Lambrache et al. |
| 2007/0229129 A1 | 10/2007 | Nakagawa |
| 2008/0010429 A1 | 1/2008 | Rao |
| 2008/0049484 A1 | 2/2008 | Sasaki |
| 2008/0068096 A1 | 3/2008 | Feng et al. |
| 2008/0079467 A1 | 4/2008 | Hou et al. |
| 2008/0080230 A1 | 4/2008 | Liaw |
| 2008/0117707 A1 | 5/2008 | Manickavasakam et al. |
| 2008/0129402 A1 | 6/2008 | Han et al. |

(56) References Cited

U.S. PATENT DOCUMENTS

| | | |
|---|---|---|
| 2008/0155362 A1 | 6/2008 | Chang et al. |
| 2008/0175039 A1 | 7/2008 | Thomas et al. |
| 2008/0181029 A1 | 7/2008 | Joshi et al. |
| 2008/0265957 A1 | 10/2008 | Luong et al. |
| 2008/0273361 A1 | 11/2008 | Dudeck et al. |
| 2009/0027947 A1 | 1/2009 | Takeda |
| 2009/0089646 A1 | 4/2009 | Hirose et al. |
| 2009/0141566 A1 | 6/2009 | Arsovski |
| 2009/0154257 A1 | 6/2009 | Fukaishi et al. |
| 2009/0161468 A1 | 6/2009 | Fujioka |
| 2009/0231943 A1 | 9/2009 | Kunce et al. |
| 2009/0256642 A1 | 10/2009 | Lesso |
| 2009/0296869 A1 | 12/2009 | Chao et al. |
| 2009/0319871 A1 | 12/2009 | Shirai et al. |
| 2010/0020590 A1 | 1/2010 | Hsueh et al. |
| 2010/0085086 A1 | 4/2010 | Nedovic et al. |
| 2010/0157715 A1 | 6/2010 | Pyeon |
| 2010/0169675 A1 | 7/2010 | Kajihara |
| 2010/0172190 A1 | 7/2010 | Lavi et al. |
| 2010/0177571 A1 | 7/2010 | Shori et al. |
| 2010/0214815 A1 | 8/2010 | Tam et al. |
| 2010/0232202 A1 | 9/2010 | Lu et al. |
| 2010/0260001 A1 | 10/2010 | Kasprak et al. |
| 2010/0271138 A1 | 10/2010 | Thakur et al. |
| 2010/0322022 A1 | 12/2010 | Shinozaki et al. |
| 2011/0018597 A1 | 1/2011 | Lee et al. |
| 2011/0063898 A1 | 3/2011 | Ong |
| 2011/0153932 A1 | 6/2011 | Ware et al. |
| 2011/0211401 A1 | 9/2011 | Chan et al. |
| 2011/0267914 A1 | 11/2011 | Ishikura et al. |
| 2011/0280307 A1 | 11/2011 | Macinnis et al. |
| 2011/0292743 A1 | 12/2011 | Zimmerman |
| 2011/0299353 A1 | 12/2011 | Ito et al. |
| 2012/0049911 A1 | 3/2012 | Ura |
| 2012/0133114 A1 | 5/2012 | Choi et al. |
| 2012/0153999 A1 | 6/2012 | Kim |
| 2012/0242382 A1 | 9/2012 | Tsuchiya et al. |
| 2012/0243347 A1 | 9/2012 | Sampigethaya et al. |
| 2012/0250440 A1 | 10/2012 | Wu |
| 2012/0281459 A1* | 11/2012 | Teman ............... G11C 11/413 365/156 |
| 2012/0327704 A1 | 12/2012 | Chan et al. |
| 2013/0039131 A1 | 2/2013 | Haig et al. |
| 2013/0083591 A1 | 4/2013 | Wuu et al. |
| 2013/0170289 A1 | 7/2013 | Grover et al. |
| 2014/0056093 A1 | 2/2014 | Tran et al. |
| 2014/0125390 A1 | 5/2014 | Ma |
| 2014/0136778 A1 | 5/2014 | Khailany et al. |
| 2014/0185366 A1 | 7/2014 | Chandwani et al. |
| 2014/0269019 A1 | 9/2014 | Kolar et al. |
| 2015/0003148 A1 | 1/2015 | Iyer et al. |
| 2015/0029782 A1 | 1/2015 | Jung et al. |
| 2015/0063052 A1 | 3/2015 | Manning |
| 2015/0187763 A1 | 7/2015 | Kim et al. |
| 2015/0213858 A1 | 7/2015 | Tao et al. |
| 2015/0248927 A1 | 9/2015 | Fujiwara et al. |
| 2015/0279453 A1 | 10/2015 | Fujiwara et al. |
| 2015/0302917 A1 | 10/2015 | Grover et al. |
| 2015/0310901 A1 | 10/2015 | Jung et al. |
| 2015/0357028 A1 | 12/2015 | Huang et al. |
| 2016/0005458 A1 | 1/2016 | Shu et al. |
| 2016/0027500 A1 | 1/2016 | Chuang et al. |
| 2016/0064068 A1 | 3/2016 | Mojumder et al. |
| 2016/0141023 A1 | 5/2016 | Jung et al. |
| 2016/0225436 A1 | 8/2016 | Wang et al. |
| 2016/0225437 A1 | 8/2016 | Kumar et al. |
| 2016/0247559 A1* | 8/2016 | Atallah ............... H01L 27/1104 |
| 2016/0284392 A1 | 9/2016 | Block et al. |
| 2016/0329092 A1 | 11/2016 | Akerib |
| 2017/0194046 A1 | 7/2017 | Yeung, Jr. et al. |
| 2017/0345505 A1 | 11/2017 | Noel et al. |
| 2018/0122456 A1 | 5/2018 | Li et al. |
| 2018/0123603 A1 | 5/2018 | Chang |
| 2018/0157621 A1 | 6/2018 | Shu et al. |
| 2018/0158517 A1 | 6/2018 | Shu et al. |
| 2018/0158518 A1 | 6/2018 | Shu et al. |
| 2018/0158519 A1 | 6/2018 | Shu et al. |
| 2018/0158520 A1 | 6/2018 | Shu et al. |
| 2020/0117398 A1 | 4/2020 | Haig et al. |
| 2020/0160905 A1 | 5/2020 | Charles et al. |
| 2020/0301707 A1 | 9/2020 | Shu et al. |
| 2020/0403616 A1 | 12/2020 | Shu et al. |

OTHER PUBLICATIONS

Wang et al., "A Two-Write and Two-Read Multi-Port SRAM with Shared Write Bit-Line Scheme and Selective Read Path for Low Power Operation", Journal of Low Power Electronics vol. 9. 9-22, 2013, Department of Electronics Engineering and Institute of Electronics, National Chiao-Tung University, Hsinchu 300, Taiwan (Received: Oct. 15, 2012: Accepted: Feb. 11, 2013), 14 pages.

\* cited by examiner

| WE | WBL | WBLb | D(n) |
|---|---|---|---|
| 0 | x | x | D(n-1) |
| 1 | 0 | 1 | 0 |
| 1 | 1 | 0 | 1 |
| 1 | 0 | 0 | D(n-1) |

D(n) is storage data on the current write cycle
D(n-1) is storage data before the current write cycle

Fig 3

ULTRA LOW VDD MEMORY CELL WITH RATIOLESS WRITE PORT

RELATED APPLICATIONS

This application is a continuation in part of U.S. application Ser. No. 15/709,401 filed Sep. 19, 2017 (now issued as U.S. Pat. No. 10,249,362 on Apr. 2, 2019) and Ser. No. 15/709,399 filed Sep. 19, 2017, both of which claim the benefit under 35 USC 119(e) of U.S. Provisional Application No. 62/430,767 filed Dec. 6, 2016 and entitled "Computational Dual Port SRAM Cell And Processing Array Device Using The Dual Port SRAM Cells For Xor And Xnor Computations", the entirety of all of which are incorporated herein by reference.

FIELD

The disclosure relates generally to a static random access memory cell that may be used for computations.

BACKGROUND

An array of memory cells, such as dynamic random access memory (DRAM) cells, static random access memory (SRAM) cells, content addressable memory (CAM) cells or non-volatile memory cells, is a well-known mechanism used in various computer or processor based devices to store digital bits of data. The various computer and processor based devices may include computer systems, smartphone devices, consumer electronic products, televisions, internet switches and routers and the like. The array of memory cells are typically packaged in an integrated circuit or may be packaged within an integrated circuit that also has a processing device within the integrated circuit. The different types of typical memory cells have different capabilities and characteristics that distinguish each type of memory cell. For example, DRAM cells take longer to access, lose their data contents unless periodically refreshed, but are relatively cheap to manufacture due to the simple structure of each DRAM cell. SRAM cells, on the other hand, have faster access times, do not lose their data content unless power is removed from the SRAM cell and are relatively more expensive since each SRAM cell is more complicated than a DRAM cell. CAM cells have a unique function of being able to address content easily within the cells and are more expensive to manufacture since each CAM cell requires more circuitry to achieve the content addressing functionality.

Various computation devices that may be used to perform computations on digital, binary data are also well-known. The computation devices may include a microprocessor, a CPU, a microcontroller and the like. These computation devices are typically manufactured on an integrated circuit, but may also be manufactured on an integrated circuit that also has some amount of memory integrated onto the integrated circuit. In these known integrated circuits with a computation device and memory, the computation device performs the computation of the digital binary data bits while the memory is used to store various digital binary data including, for example, the instructions being executed by the computation device and the data being operated on by the computation device.

More recently, devices have been introduced that use memory arrays or storage cells to perform computation operations. In some of these devices, a processor array to perform computations may be formed from memory cells. These devices may be known as in-memory computational devices.

Big data operations are data processing operations in which a large amount of data must be processed. Machine learning uses artificial intelligence algorithms to analyze data and typically require a lot of data to perform. The big data operations and machine learning also are typically very computationally intensive applications that often encounter input/output issues due to a bandwidth bottleneck between the computational device and the memory that stores the data. The above in-memory computational devices may be used, for example, for these big data operations and machine learning applications since the in-memory computational devices perform the computations within the memory thereby eliminating the bandwidth bottleneck.

An SRAM cell can be configured to perform Boolean operations such as AND, OR, NAND and NOR, Exclusive OR and NOR. This SRAM cell can also support a Selective Write operation. However, the typical SRAM cell requires stronger writing transistors than the transistors in the storage latch to over write the storage data. A ratio of the transistor strengths of the write transistor and the storage transistor may be known as a write ratio. For a typical SRAM cell, the write ratio is 2 to 3 meaning that the writing transistor is 2 to 3 times of the strength of the storage transistor for the writing to be successful. Thus, it is desired to provide a computational memory cell, that may be an SRAM cell, with a write port to perform Boolean operations such as AND, OR, NAND, NOR, XOR (Exclusive OR) and XNOR (Exclusive NOR) that is able to do the writing ratioless.

BRIEF DESCRIPTION OF THE DRAWINGS

FIG. 3 illustrates a write port truth table for the dual port SRAM cell of FIG. 1 with a selective write function;

DETAILED DESCRIPTION OF ONE OR MORE EMBODIMENTS

The disclosure is particularly applicable to a CMOS implemented memory cell and processing array with a plurality of the memory cells that are capable to performing logic functions with a ratioless write port and it is in this context that the disclosure will be described. It will be appreciated, however, that the memory cell and processing array has greater utility and is not limited to the below disclosed implementations since the memory cell may be constructed using different processes and may have different circuit configurations than those disclosed below that perform the logic function and so are within the scope of this disclosure. For purposes of illustration, a dual port SRAM and 3-port cells are disclosed below and in the figures. However, it is understood that the SRAM computation cell and processing array may also be implemented with an SRAM cell having more ports and the disclosure is not limited to the SRAM cells disclosed below. It is also understood that the SRAM cells having more ports may be slightly differently constructed than the SRAM cells shown in the figures, but one skilled in the art would understand how to construct those SRAMs with more ports from the disclosure below.

Furthermore, although an SRAM cell is used in the examples below, it is understood that the disclosed memory cell for computation and the processing array using the memory cells may be implemented using various different types of memory cells including DRAMs, CAMs, non-volatile memory cells and non-volatile memory devices and these implementations using the various types of memory cells are within the scope of the disclosure.

Figure 1:
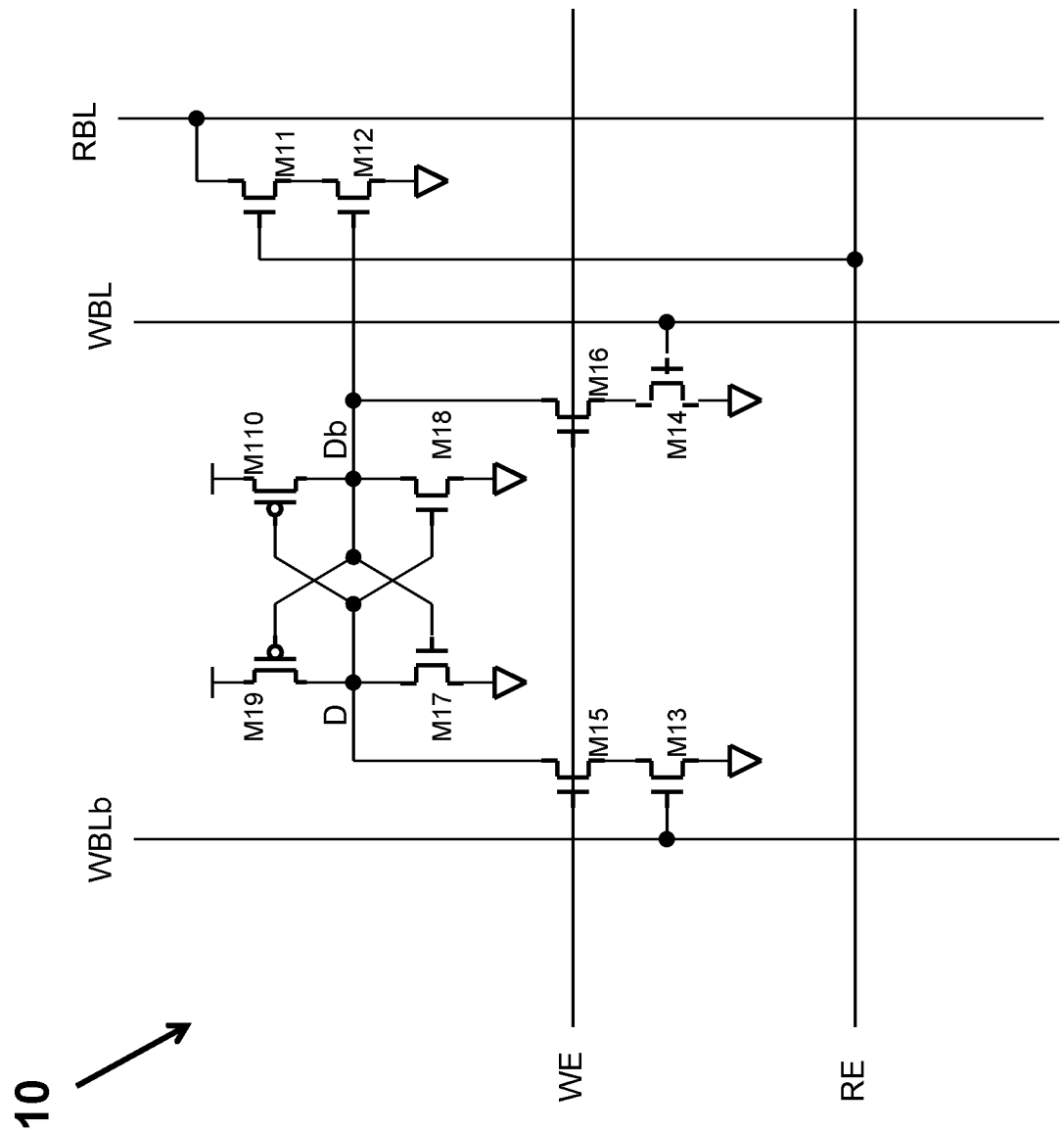
FIG. 1 illustrates a dual port SRAM cell that can perform Boolean operations.

FIG. 1 illustrates a dual port SRAM cell 10 that may be used for computation. The dual port SRAM cell may include two cross coupled inverters (transistors M17, M19 pair as one inverter and transistors M18 and M110 pair as another inverter) that form a latch or storage cell and access transistors M11-M16 that are coupled together as shown in FIG. 1 to form an SRAM cell. The SRAM cell may be operated as a storage latch and may have a read port and a write port so that the SRAM cell is a dual port SRAM cell. The two inverters are cross coupled since the input of the first inverter is connected to the output of the second inverter and the output of the first inverter is coupled to the input of the second inverter as shown in FIG. 1.

A Write Word line carries a signal and is called WE (see FIG. 1) and a write bit line and its complement are called WBL and WBLb, respectively. The Write word line (WE) is coupled to the gate of each of the two access transistors M15, M16 that are part of the SRAM cell. The write bit line and its complement (WBL and WBLb) are each coupled to a gate of the respective access transistors M13, M14 as shown in FIG. 1 and M13 is coupled to M15 and M14 is coupled to M16. The source of each of transistors M13 and M14 is coupled to ground. The drain of each of those access transistors M15, M16 is coupled to each side of the cross coupled inverters (labeled D and Db in FIG. 1).

The circuit in FIG. 1 may also have a read word line RE, a read bit line RBL and a read port formed by transistors M11, M12 coupled together to form an isolation circuit. The read word line RE may be coupled to the gate of transistor M11 that forms part of the read port while the read bit line is coupled to the drain terminal of transistor M11. The gate of transistor M12 may be coupled to the Db output from the cross coupled inverters and the source of transistor M12 may be coupled to ground.

In operation, the dual port SRAM cell may read data stored in the latch using a signal on the read word line (RE) to address/activate the dual port SRAM cell and the read bit line (RBL) to read the data stored in the dual port SRAM cell. The dual port SRAM cell may write data into the dual port SRAM cell by addressing/activating the dual port SRAM cell using a signal on the write word line (WE) and then writing data into the dual port SRAM cell using the write bit lines (WBL, WBLb).

During reading, multiple cells (with only a single cell being shown in FIG. 1 but multiple cells shown in FIG. 2) can be turned on to perform an AND function between the data stored in the cells that were turned on. For example, a number of cells in a column of the processing array 20 in FIG. 2, such as cell 00, . . . , cell m0, may be activated by the RE signal for each of those cells. Thus, at the beginning of the read cycle, RBL is pre-charged high and if the Db signal of all cells that are turned on by RE are "0", then RBL stays high. Although the gate of transistor M11 is turned on by the RE signal, the gate of M12 is not turned on since the Db signal is low. As a result, the RBL line is not connected to the ground to which the source of transistor M12 is connected and the RBL line is not discharged. The write operation is activated by WE and the data is written by toggling of WBL and WBLb. The read operation is activated by RE and the read data is accessed on RBL.

The cell 10 may further be used for computation where RBL is also used to perform logic operation(s). If the Db signal of any or all of the cells activated is "1" then RBL is discharged to 0 since the gate of M12 is turned on and the RBL line is connected to ground. As a result, RBL=NOR (Db0, Db1, etc.) where Db0, Db1, etc. are the complementary data of the SRAM cells that have been turned on by the RE signal. Alternatively, RBL=NOR (Db0, Db1, etc.)=AND (D0, D1, etc.), where D0, D1, etc. are the true data of the cells that have been turned on by the RE signal.

As shown in FIG. 1, the Db signal of the cell 10 may be coupled to a gate of transistor M12 to drive the RBL line. The Db signal is isolated from the RBL line and its signal/voltage level by the transistors M11, M12 (together forming the isolation circuit). Because the Db signal/value is isolated from the RBL line and signal/voltage level, the Db signal is not susceptible to the lower bit line level caused by multiple "0" data stored in multiple cells. Therefore, for the cell in FIG. 1, there is no limitation of how many cells can be turned on to drive RBL. As a result, the cell (and the device made up of multiple cells) offers more operands for the Boolean functions such as AND function described above and NOR/OR/NAND/XOR/XNOR functions described in co-pending and commonly owned Ser. No. 15/709,401 filed Sep. 19, 2017 (now issued as U.S. Pat. No. 10,249,362 on Apr. 2, 2019) and Ser. No. 15/709,399 filed Sep. 19, 2017 and U.S. Provisional Application No. 62/430,767 filed Dec. 6, 2016 (incorporated herein by reference) since there is no limit of how many cells can be turned on to drive RBL. In addition to the AND function described above, the SRAM cell 10 in FIG. 1 also may perform a NOR function by storing inverted data. Specifically, if D is stored at the gate of M12, instead of Db, then RBL=NOR (D0, D1, etc.).

Figure 2:
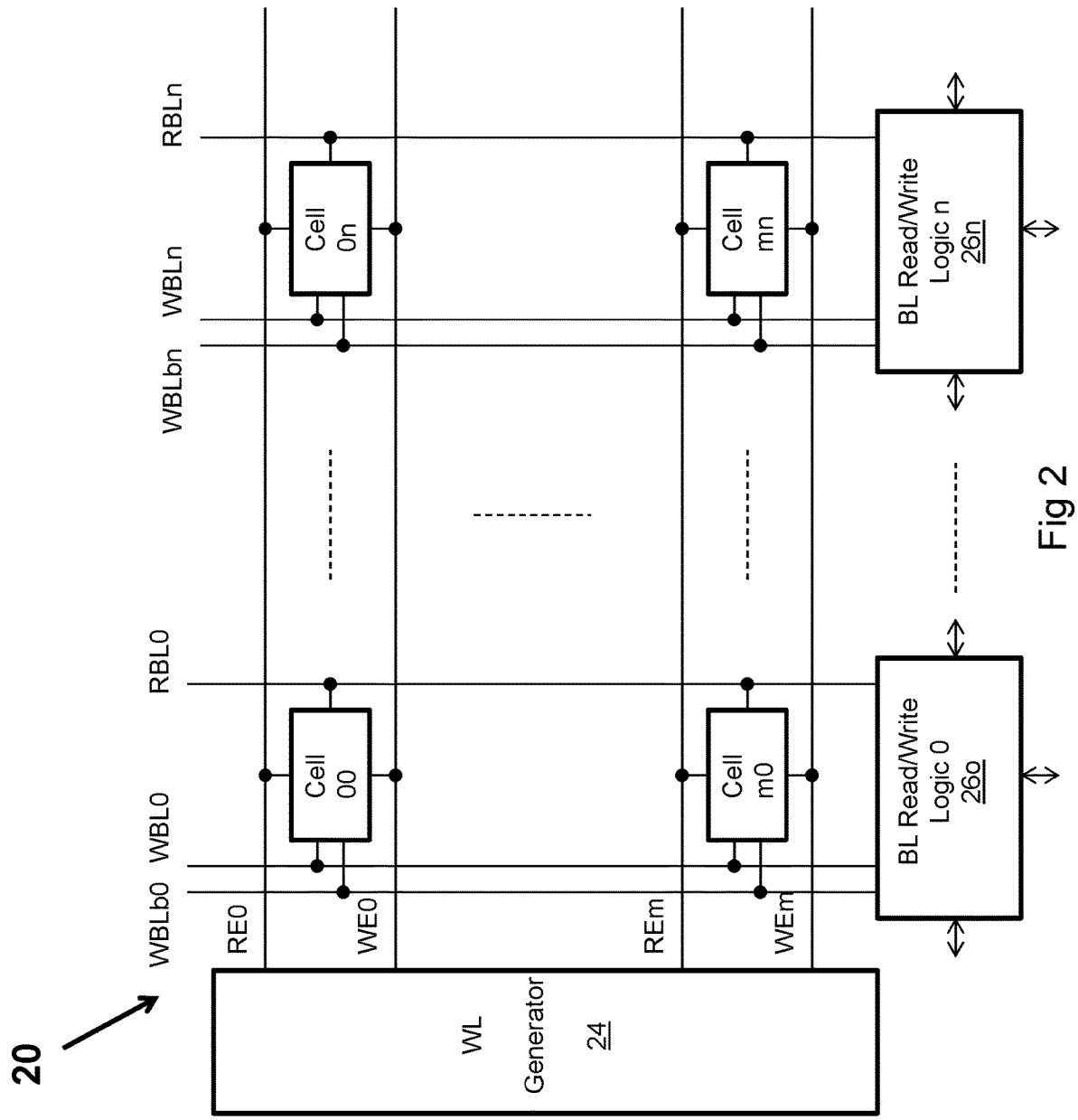
FIG. 2 illustrates an implementation of a processing array that has a plurality of the SRAM cells shown in FIG. 1 and performs logic functions.

FIG. 2 illustrates a processing array device 20 that may incorporate the dual port SRAM cell of FIG. 1, in which each cell, such as cell 00, . . . , cell 0n and cell m0, . . . , cell mn, is the cell shown in FIG. 1. The cells form an array of cells laid out as shown in FIG. 2. The processing array 20 may perform computations using the computational capabilities of the dual port SRAM cell described above. The array device 20 may be formed by M word lines (such as RE0, WE0, . . . , REm, WEm) and N bit lines (such as WBL0, WBLb0, RBL0, . . . , WBLn, WBLbn, RBLn.) The array device 20 may also include a word line generator 24 (WL Generator) that generates word line signals as well as a plurality of bit line read/write logic 26 (such as BL Read/Write Logic 0, . . . , BL Read/Write Logic n) that perform read and write operations using the bit lines. The array device 20 may be manufactured on an integrated circuit or may be integrated into another integrated circuit depending on the use of the processing array 20.

In a read cycle, the word line generator 24 may generate one or multiple RE signals in a cycle to turn on/activate one or more cells and the RBL lines of the cells activated by the RE signal form AND or NOR functions whose output is sent to a respective BL Read/Write Logic (26o, . . . , 26n). Each BL Read/Write Logic 26 processes the RBL result (the result of the AND or NOR operation) and sends the results back to its WBL/WBLb for use/writing back to the same BL, or to the neighboring BL Read/Write Logic 26 for use/writing back to the neighboring BL, or send it out of the processing array. Alternatively, the BL Read/Write logic 26 can store the RBL result from its own bit line or from the neighboring bit line in a latch within the BL Read/Write Logic so that, during a next or later cycle, the BL Read/Write logic 26 can perform logic with the latched data that is the RBL result.

In a write cycle, the word line generator 24 generates one or more WE signals for the cells into which data is to be written. The BL Read/Write Logic (26o, . . . , 26n) processes the write data, either from its own RBL, or from the neighboring RBL, or from out of the processing array 20. The ability of BL Read/Write Logic 26 to process the data from the neighboring bit line means that the data can be shifting from one bit line to the neighboring bit line and one or more or all bit lines in the processing array may be shifting concurrently. The BL Read/Write Logic 26 can also decide not to write for a Selective Write operation based on the RBL result. For example, the data on the WBL line can be written to a cell if RBL=1. If RBL=0, then the write operation is not performed.

FIG. 3 illustrates a write port truth table for the dual port SRAM cell of FIG. 1. If WE is 0, no write is performed (as reflected by the D(n−1) shown in FIG. 3). If WE is 1, then the storage nodes D and its complement Db are written by WBL and WBLb. D=1 and Db=0 if WBL=1 and WBLb=0. D=0 and Db=1 if WBL=0 and WBLb=1. If both WBL and WBLb are 0, then no write is performed. So this cell can perform Selective Write function with WBL=WBLb=0, with WE=1.

The write operation for the circuit is now described in more detail with reference to FIG. 1. When WE=1 and either WBL and WBLb is 1, the writing is performed. To write D from 1 to 0, then WBLb=1 and WBL=0, M13 and M15 are turned on to overcome the strength of PMOS transistor M19. On 16 nm or more advanced process technology with FINFET transistors, PMOS transistor normally has almost same driver strength as an NMOS transistor, and driver strength of M13 and M15 in series need to be 3 times or more than the driver strength of M19 to be able to perform the writing successfully. Therefore M13 and M15 each needs to be 6 times of driver strength of M19. Similarly M14 and M16 each needs to be 6 times of M110. This makes M13, M14, M15 and M16 transistors sizes very large that in turn results in the cell 10 size of FIG. 1 being large.

Figure 4:
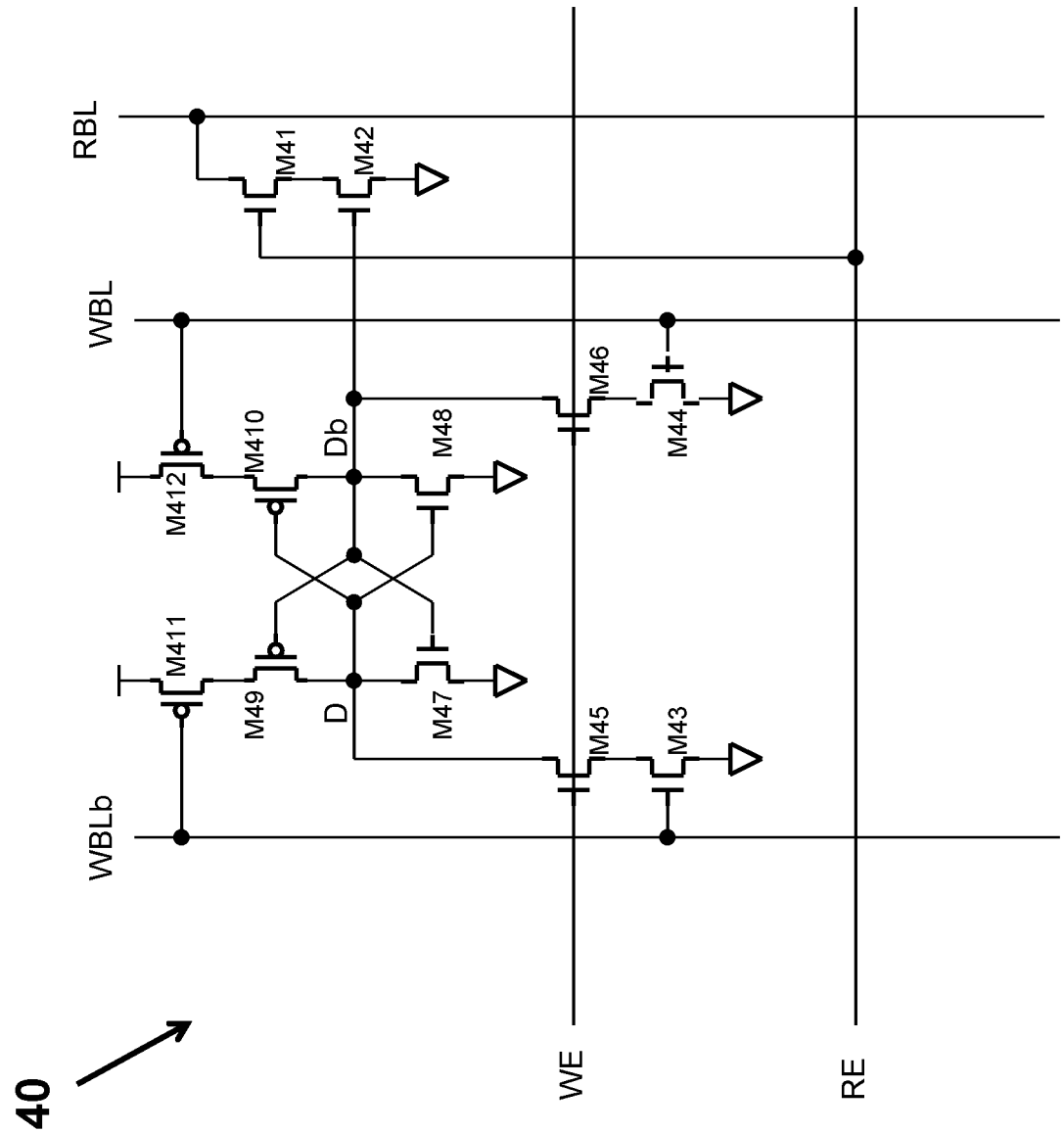
FIG. 4 illustrates an implementation of a dual port SRAM cell that can perform Boolean operations and ratioless selective write.

The circuit 40 in FIG. 4 improves the write port transistor size issue by modifying the circuit shown in FIG. 1 to be ratioless during a write operation. The table in FIG. 3 applies to circuit 40 in FIG. 4 since the circuit 40 in FIG. 4 has the same elements and operates in the same manner as the circuit 10 in FIG. 1, but has a ratioless write operation as described below. The cell 40 may also replace the cell 10 and be used seamlessly in the processing array 20 in FIG. 2.

In the cell 40 in FIG. 4, if WE=0, no write is performed by the circuit in FIG. 4. If WE is 1, then the storage nodes D and its complement Db are written by WBL and WBLb in which D=1 and Db=0 if WBL=1 and WBLb=0 and D=0 and D=1 if WBL=0 and WBLb=1. If both WBL and WBLb are 0, then no write is performed so this cell 40 can perform a selective write function with WBL=WBLb=0 and with WE=1 as did the circuit 10 in FIG. 1.

In FIG. 4, when WE=1, WBLb=1 and WBL=0, transistors M43 and M45 are on and data D is written from 1 to 0 without the pull up strength of series PMOS transistors of M49 and M411 because transistor M411 is turned off when its gate is tied to WBLb which is 1. Furthermore, because WBL=0, transistor M412 is turned on and data D is pulled down to 0, therefore Db is pulled up from 0 to 1 and the writing is completed. In this write operation using the circuit 40 in FIG. 4, there is no write ratio in the write operation as M43 and M45 pull down D without the need to overcome the PMOS pull up strength of the storage transistor.

Similarly, when WE=1, WBLb=0 and WBL=1, transistors M44 and M46 are on and data Db is written from 1 to 0 without needing to overcome the pull up strength of series PMOS transistor M410 and M412 because transistor M412 is turned off with the gate tied to WBL. Similarly, in this write operation, there is no write ratio in the write operation as M44 and M46 operate without the need to overcome the storage PMOS pull up strength.

In this manner, write port transistor M43, M44, M45 and M46 may be the same minimum size of transistor as PMOS transistors M49, M410, M411 and M412. Thus, the cell 40 size can be reduced and the write port is not affected by the write ratio. Note that when WE=0, no write is performed, but M411 or M412 may be turned ON when WBLb or WBL is 1. This could leave D or Db as floating 1 which is acceptable because the write cycle is only for a short period of time and nodes D and Db have enough capacitance to hold the change to keep the value in the storage cell unchanged in this situation. In the normal operation when it is not a write cycle, both WBLb and WBL are low to keep the cross coupled transistors M47, M48, M49 and M410 operating as the cross coupled latch of the SRAM cell 40.

In the circuit 40 shown in FIG. 4, series transistor pair M49, M411 and M410, M412 can swap position to achieve the same function. For example, M49 may have its gate tied to Db and is coupled to VDD and the source of M411 while M411 has its gate tied to WBLb that is coupled to D. Similarly series transistor pair M43, M45 and M44, M46 can swap position to achieve the same function.

In summary, a ratioless write is performed with write bit line (WBL) or complementary write bit line (WBLb) to write the "0" node of the storage latch with its pull up transistor disabled and to write the "1" node of the storage latch with its pull up transistor enabled. The cell 40 in FIG. 4 can be used in the processing array 20 in FIG. 2 in the same way as cell 10 in FIG. 1.

Figure 5:
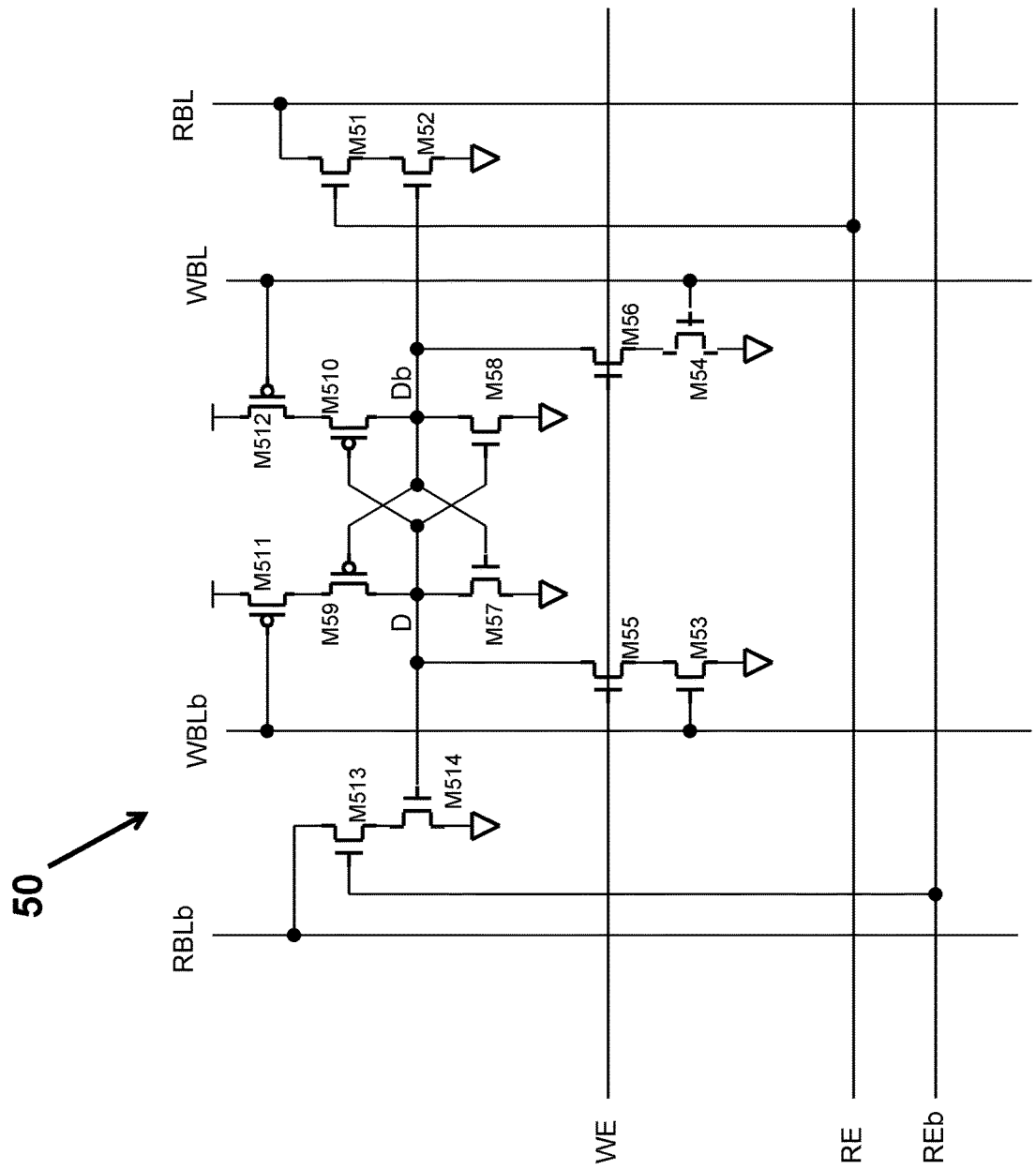
FIG. 5 illustrates an implementation of a 3-port SRAM cell that can perform basic Boolean operations, XOR and XNOR functions and ratioless selective write.

FIG. 5 illustrates an implementation of a 3-port SRAM cell 50 that can perform basic Boolean operations, XOR and XNOR functions and ratioless selective write. The cell 50 has the same storage latch and write port circuitry as cell 40, therefore, the same ratioless selective write operation as cell 40. The cell 50 in FIG. 5 adds another read port to the cell 40 in FIG. 4. Transistors M513 and M514 are added to form the second read port and an isolation circuit for that second read port. In this circuit 50, the complementary read word line REb may be coupled to the gate of transistor M513 that forms part of the read port while the complementary read bit line RBLb is coupled to the drain terminal of transistor M513. The gate of transistor M514 may be coupled to the D output from the cross coupled inverters and the source of transistor M514 may be coupled to ground.

During reading, multiple cells (with only a single cell being shown in FIG. 5 but multiple cells shown in a processing array 60 in FIG. 6) can be turned on to perform an AND function between the complementary data stored in the cells that were turned on. During the read, the RBLb line is precharged high. If the D signal of any or all of the cells activated is "1" then RBLb is discharged to 0 since the gate of M514 is turned on and the RBLb line is connected to ground. As a result, RBLb=NOR (D0, D1, etc.) where D0, D1, etc. are the data of the SRAM cells that have been turned on by the REb signal. Alternatively, RBLb=NOR (D0, D1, etc.)=AND (Db0, Db1, etc.), where Db0, Db1, etc. are the complement data of the cells that have been turned on by the REb signal. Thus, cell 50 performs as 3-port SRAM cell with a write port (controlled by WE) and 2 read ports (controlled by RE and Reb) with RBL=AND (D0, D1, etc) and RBLb=(D0b, D1b, etc).

Figure 6:
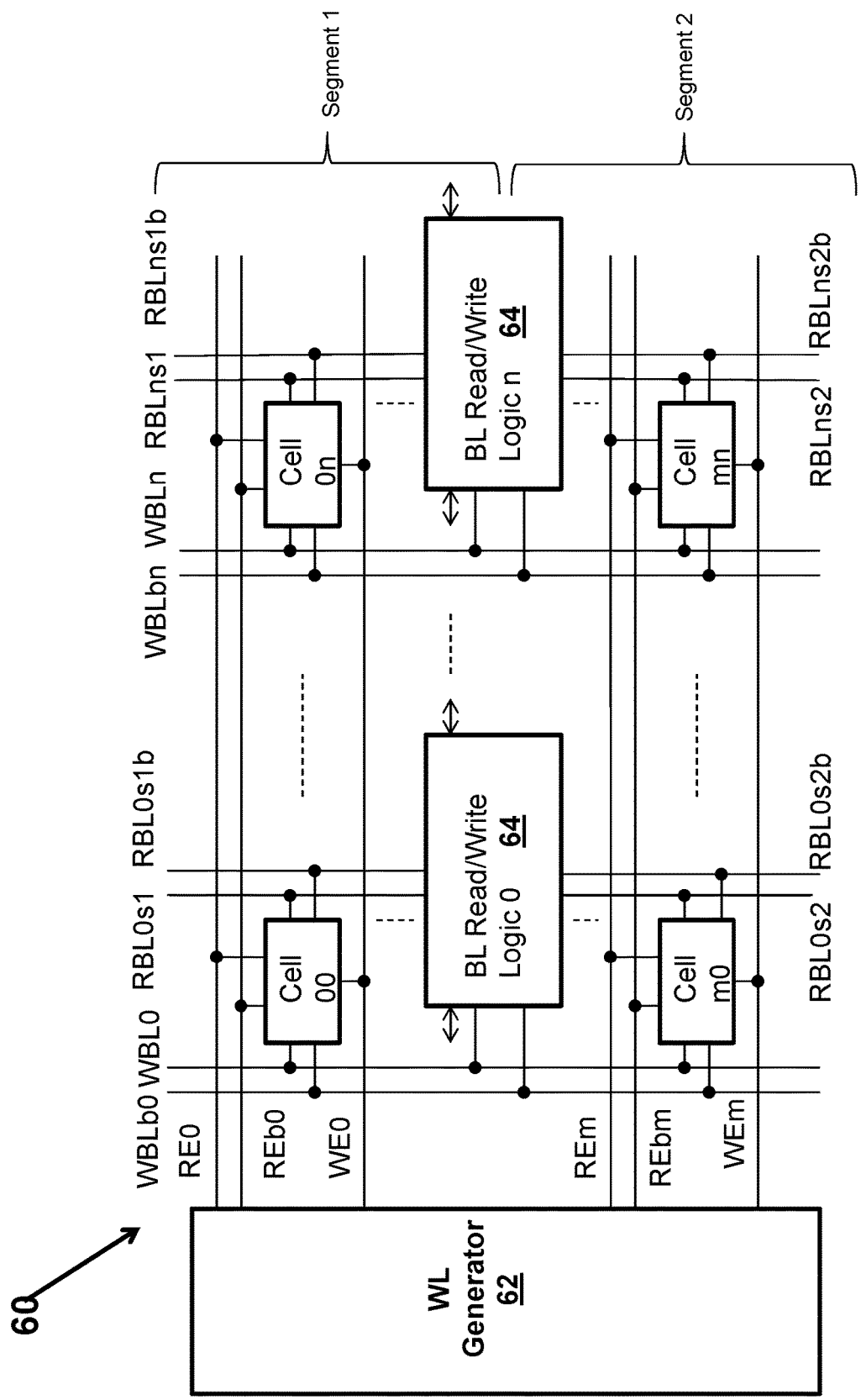
FIG. 6 illustrates an implementation of a processing array that has a plurality of the SRAM cells shown in FIG. 5 and performs basic Boolean operations, XOR and XNOR functions.

FIG. 6 illustrates an implementation of a processing array 60 that has a plurality of the 3-port SRAM cells shown in FIG. 5 in an array and split segments (Segment 1 and Segment 2 as shown) and each of the bit line (BL) read/write logic circuitry 64 (BL Read/Write Logic 0, . . . , BL Read/Write Logic n for each bit line) in the middle of each bit line. This processing array has a word line generator 62 that generates control signals (RE0, . . . , REm, REb0, . . . , REbm and WE0, . . . , WEm) and each bit line has the two segments. In one embodiment, segment 1 has RBLs1 and RBLs1b read bit lines (RBL0s1, . . . , RBLns1 and RBL0s1b, . . . , RBLns1b) with number of cells connected on it (cell 00, . . . , cell 0n in the example in FIG. 6) which are all connected to the BL read/write circuitry 64 and segment 2 has RBLs2 and RBLs2b lines (RBL0s2, . . . , RBLns2 and RBL0s2b, . . . , RBLns2b) with a number of cells (cell m0, . . . , cell mn in the example in FIG. 6) which are all connected to another input of the BL read/write circuitry 64.

In a read cycle, the word line generator may generate one or multiple RE, REb signals in a cycle to turn on/activate one or more cells and the RBL, RBLb lines of the cells activated by the RE and REb signals form AND or NOR functions whose output is sent to the respective BL Read/Write Logic 64 for each bit line. Each BL Read/Write Logic 64 processes the RBL result (the result of the AND or NOR operation) and sends the results back to its WBL/WBLb for use/writing back to the same cell, or to the neighboring BL Read/Write Logic for use/writing back to the neighboring cell, or send it out of the processing array. Alternatively, the BL Read/Write logic 64 can store the RBL result from its own bit line or from the neighboring bit line in a latch within the BL Read/Write Logic so that, during a next or later cycle, the Read/Write logic can perform logic with the latched data that is the RBL result.

In a write cycle using the processing array in FIG. 6, the word line generator 62 generates one or more WE signals for the one or more cells into which data is to be written. The BL Read/Write Logic 64 processes the write data, either from its own RBL, or from the neighboring RBL, or from out of the processing array. The ability of BL Read/Write Logic 64 to process the data from the neighboring bit line (note the connections between the bit lines and each BL Read/Write Logic 64) means that the data can be shifting from one bit line to the neighboring bit line and one or more or all bit lines in the processing array may be shifting concurrently. The BL Read/Write Logic 64 can also decide not to write for a Selective Write operation based on the RBL or RBLb result. For example, the data on the WBL line can be written to a cell if RBL=1. If RBL=0, then write operation is not performed.

SRAM Ultralow VDD Operation SRAM

The cells 40 and 50 described here are for computation memory applications, but these cells in FIGS. 4 and 5 can be operated as an SRAM cell with great noise immunity and ultralow VDD operation. Specifically, the VDD operation level can be as low as the threshold voltage of NMOS and PMOS transistors of the cell.

Isolated Storage Latch:

the read or write operation will not affect the stability of storage latch. The VDD operation level for storage is as low as the threshold voltage of NMOS and PMOS transistors for the cross coupled latch to be active.

Buffered Read:

the read bit line voltage level will not affect the stability of the storage node. The read bit line is pre-charged high and be discharged by the turning on of the read port access transistors. The VDD operation level is as low as the threshold voltage of read port NMOS transistors.

Ratioless Write:

The writing to the storage latch occurs by just turning on the NMOS or PMOS transistors of the write port without write ratio. The VDD operation level is as low as the threshold voltage of write port NMOS and PMOS transistors.

The foregoing description, for purpose of explanation, has been described with reference to specific embodiments. However, the illustrative discussions above are not intended to be exhaustive or to limit the disclosure to the precise forms disclosed. Many modifications and variations are possible in view of the above teachings. The embodiments were chosen and described in order to best explain the principles of the disclosure and its practical applications, to thereby enable others skilled in the art to best utilize the disclosure and various embodiments with various modifications as are suited to the particular use contemplated.

The system and method disclosed herein may be implemented via one or more components, systems, servers, appliances, other subcomponents, or distributed between such elements. When implemented as a system, such systems may include an/or involve, inter alia, components such as software modules, general-purpose CPU, RAM, etc. found in general-purpose computers. In implementations where the innovations reside on a server, such a server may include or involve components such as CPU, RAM, etc., such as those found in general-purpose computers.

Additionally, the system and method herein may be achieved via implementations with disparate or entirely different software, hardware and/or firmware components, beyond that set forth above. With regard to such other components (e.g., software, processing components, etc.) and/or computer-readable media associated with or embodying the present inventions, for example, aspects of the innovations herein may be implemented consistent with numerous general purpose or special purpose computing systems or configurations. Various exemplary computing systems, environments, and/or configurations that may be suitable for use with the innovations herein may include, but are not limited to: software or other components within or embodied on personal computers, servers or server computing devices such as routing/connectivity components, handheld or laptop devices, multiprocessor systems, microprocessor-based systems, set top boxes, consumer electronic devices, network PCs, other existing computer platforms, distributed computing environments that include one or more of the above systems or devices, etc.

In some instances, aspects of the system and method may be achieved via or performed by logic and/or logic instructions including program modules, executed in association with such components or circuitry, for example. In general, program modules may include routines, programs, objects, components, data structures, etc. that perform particular tasks or implement particular instructions herein. The inventions may also be practiced in the context of distributed software, computer, or circuit settings where circuitry is connected via communication buses, circuitry or links. In distributed settings, control/instructions may occur from both local and remote computer storage media including memory storage devices.

The software, circuitry and components herein may also include and/or utilize one or more type of computer readable media. Computer readable media can be any available media that is resident on, associable with, or can be accessed by such circuits and/or computing components. By way of example, and not limitation, computer readable media may comprise computer storage media and communication media. Computer storage media includes volatile and non-volatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic tape, magnetic disk storage or other magnetic storage devices, or any other medium which can be used to store the desired information and can accessed by computing component. Communication media may comprise computer readable instructions, data structures, program modules and/or other components. Further, communication media may include wired media such as a wired network or direct-wired connection, however no media of any such type herein includes transitory media. Combinations of the any of the above are also included within the scope of computer readable media.

In the present description, the terms component, module, device, etc. may refer to any type of logical or functional software elements, circuits, blocks and/or processes that may be implemented in a variety of ways. For example, the functions of various circuits and/or blocks can be combined with one another into any other number of modules. Each module may even be implemented as a software program stored on a tangible memory (e.g., random access memory, read only memory, CD-ROM memory, hard disk drive, etc.) to be read by a central processing unit to implement the functions of the innovations herein. Or, the modules can comprise programming instructions transmitted to a general purpose computer or to processing/graphics hardware via a transmission carrier wave. Also, the modules can be implemented as hardware logic circuitry implementing the functions encompassed by the innovations herein. Finally, the modules can be implemented using special purpose instructions (SIMD instructions), field programmable logic arrays or any mix thereof which provides the desired level performance and cost.

As disclosed herein, features consistent with the disclosure may be implemented via computer-hardware, software and/or firmware. For example, the systems and methods disclosed herein may be embodied in various forms including, for example, a data processor, such as a computer that also includes a database, digital electronic circuitry, firmware, software, or in combinations of them. Further, while some of the disclosed implementations describe specific hardware components, systems and methods consistent with the innovations herein may be implemented with any combination of hardware, software and/or firmware. Moreover, the above-noted features and other aspects and principles of the innovations herein may be implemented in various environments. Such environments and related applications may be specially constructed for performing the various routines, processes and/or operations according to the invention or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques.

Aspects of the method and system described herein, such as the logic, may also be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic and/or functions disclosed herein may be enabled using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media) though again does not include transitory media. Unless the context clearly requires otherwise, throughout the description, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain presently preferred implementations of the invention have been specifically described herein, it will be apparent to those skilled in the art to which the invention pertains that variations and modifications of the various implementations shown and described herein may be made without departing from the spirit and scope of the invention. Accordingly, it is intended that the invention be limited only to the extent required by the applicable rules of law.

While the foregoing has been with reference to a particular embodiment of the disclosure, it will be appreciated by those skilled in the art that changes in this embodiment may be made without departing from the principles and spirit of the disclosure, the scope of which is defined by the appended claims.

What is claimed is:

1. A memory cell comprising:
a storage cell having at least one storage PMOS transistor;
a read port coupled to the storage cell wherein the read port buffers the storage cell from signals on a read bit line and wherein the read bit line is configured to provide read access to a piece of data stored in the storage cell; and
a ratioless write port coupled to the storage cell that provides write access to the storage cell, the ratioless write port permitting data to be written into the storage cell without overcoming a drive strength of the storage PMOS transistor.

2. The memory cell of claim 1 that is capable of performing a selective write operation.

3. The memory cell of claim 1 that can operate at an ultralow VDD level.

4. The memory cell of claim 3, wherein the ultralow VDD level is as low as a threshold voltage of transistors of the cell.

5. The memory cell of claim 1, wherein the ratioless write port further comprises a write bit line and a complement write bit line, wherein a gate of PMOS transfer transistors are each connected to the write bit line and complement write bit line, respectively.

6. The memory cell of claim 5, wherein the storage cell further comprises a first inverter having an input and an output and a second inverter having an input coupled to the output of the first inverter and an output coupled to the input of the first inverter, the first inverter including the at least one storage PMOS transistor that is coupled to a first transfer PMOS transistor and the second inverter including a second storage PMOS transistor that is coupled to a second transfer PMOS transistor.

7. The memory cell of claim 6, wherein the transfer PMOS transistor turns off to cut off the storage PMOS transistor.

8. The memory cell of claim 6, wherein the at least one storage PMOS transistor is a same size as each of the transfer PMOS transistors.

* * * * *